United States Patent [19]

Hansen

[11] Patent Number: 4,720,822
[45] Date of Patent: Jan. 19, 1988

[54] HIGH FREQUENCY SIGNAL MEASUREMENT METHOD AND APPARATUS

[75] Inventor: Arne C. Hansen, Manassas, Va.

[73] Assignee: International Business Machines Corporation, Armonk, N.Y.

[21] Appl. No.: 837,117

[22] Filed: Mar. 7, 1986

[51] Int. Cl.$^4$ .............................................. G04F 87/00
[52] U.S. Cl. .................................................. 368/115
[58] Field of Search ............... 368/115, 120; 307/106, 307/107, 108; 324/51, 52

[56] References Cited

U.S. PATENT DOCUMENTS 4,230,982 10/1980 De Mesmaeker ..................... 324/52
4,440,985 4/1984 Federico et al. .................. 179/175.3

*Primary Examiner*—Bernard Roskoski
*Attorney, Agent, or Firm*—Francis J. Thornton

[57] ABSTRACT

This is an apparatus for and a method of measuring the time coherence of high frequency signals fed into different points along a high frequency transmission line regardless of where the input signal enters the line or what the propagation delay of the line is.

This describes a method and apparatus for measuring multiple unknown signals from different signal sources coupled into different points on a transmission line, which measurement is independent of the physical distances between the signal sources and the measurement device and of the propagation delay. In essence, any transmission medium positioned between the signal source and the measurement device becomes effectively transparent. This means that there is minimal signal loss and no phase change or propagation delay change due to physical position is realized. Thus, significant advantages are realized from the present invention.

This apparatus basically comprises a plurality of voltage sensors, having signal source inputs, mounted on a transmission line terminated at both ends. To each end of the line there is coupled a measurement device to permit signal measurement at both ends of the transmission line.

7 Claims, 4 Drawing Figures

TRUE (REAL) TIME RELATIONSHIP OF SIGNALS $V_1$ AND $V_2$

TIME RELATIONSHIP OF $V_1$ & $V_2$ AS MEASURED AT NODE 11

$[TD_R + (TD_1 - TD_2)]$

TIME RELATIONSHIP OF $V_1$ & $V_2$ AS MEASURED AT NODE 12

$[TD_R - (TD_1 - TD_2)]$

HIGH FREQUENCY SIGNAL MEASUREMENT METHOD AND APPARATUS

BACKGROUND OF THE INVENTION

1. Field Of The Invention

This invention relates to measurement signal sources and in particular to an apparatus and a method of measuring the time relationship of two signals from different signal sources coupled into different points on a transmission line without knowing the physical distance between the signal source and the measurement device or the propagation delays of the transmission line.

2. Description of The Prior Art

Prior art measuring devices primarily consisted of apparatus for measuring unknown network parameters or transmission media discontinuities using a known signal source. Among these are time domain reflectometry devices, frequency domain reflectometry apparatus, and network analyzers. In such apparatus the measurement of unknown signal sources is affected by the transmission line or network through which it is passing and the distance between the signal source and the transmission line as well as the distance between the measuring device and the transmission line. General reflectometry measurement type devices are shown in U.S. Pat. Nos. 4,230,982 and 4,440,985. None of these prior art devices can measure the relationship of two signals applied at different points on a transmission line without knowing the propagation delays of the line.

SUMMARY OF THE INVENTION

In the past, when more than one signal was inputted into such a high frequency transmission line and the propagation delay of the line between the ends of the line and point at which the input signals were inputted was unknown, one was unable to determine the time relationship of the two received signals.

The present inventor has solved this problem and has now devised an apparatus for and a method of measuring the time coherence of high frequency signals fed into different points along a high frequency transmission line regardless of where the input signal enters the line or what the propagation delay of the line is.

The present invention describes a method and apparatus for measuring multiple unknown signals from different signal sources coupled into different points on a transmission line, which measurement is independent of the physical distances between the signal sources and the measurement device and of the propagation delay. In essence, any transmission medium positioned between the signal source and the measurement device becomes effectively transparent. This means that there is minimal signal loss and no phase change or propagation delay change due to physical position is realized. Thus, significant advantages are realized from the present invention.

The apparatus of the present invention basically comprises a plurality of voltage sensors, having signal source inputs, mounted on a transmission line terminated at both ends. To each end of the line there is coupled a measurement device to permit signal measurement at both ends of the transmission line. Thus, when selected sensors have a logic control signal applied to them the high frequency signals from the sensors are permitted to feed into the transmission line. These high frequency signals upon entering the transmission line, via the sensors, propagate in both directions at an equal speed until they reach each end of the line where their time relationships are measured. Because the line is terminated at both ends by selected impedances, reflections do not occur. The time average of these measurements is independent of the transmission line propagation delay or the sensor positions on the transmission line and provides the true, i.e. real, time relationship of the two signals inputted onto the transmission line even though both signals are measured at the same remote points and even though the propagation delays of the line are unknown.

This will be more readily understood from the following description taken in conjunction with the drawings in which;

DETAILED DESCRIPTION OF THE PRESENT INVENTION

Figure 1:
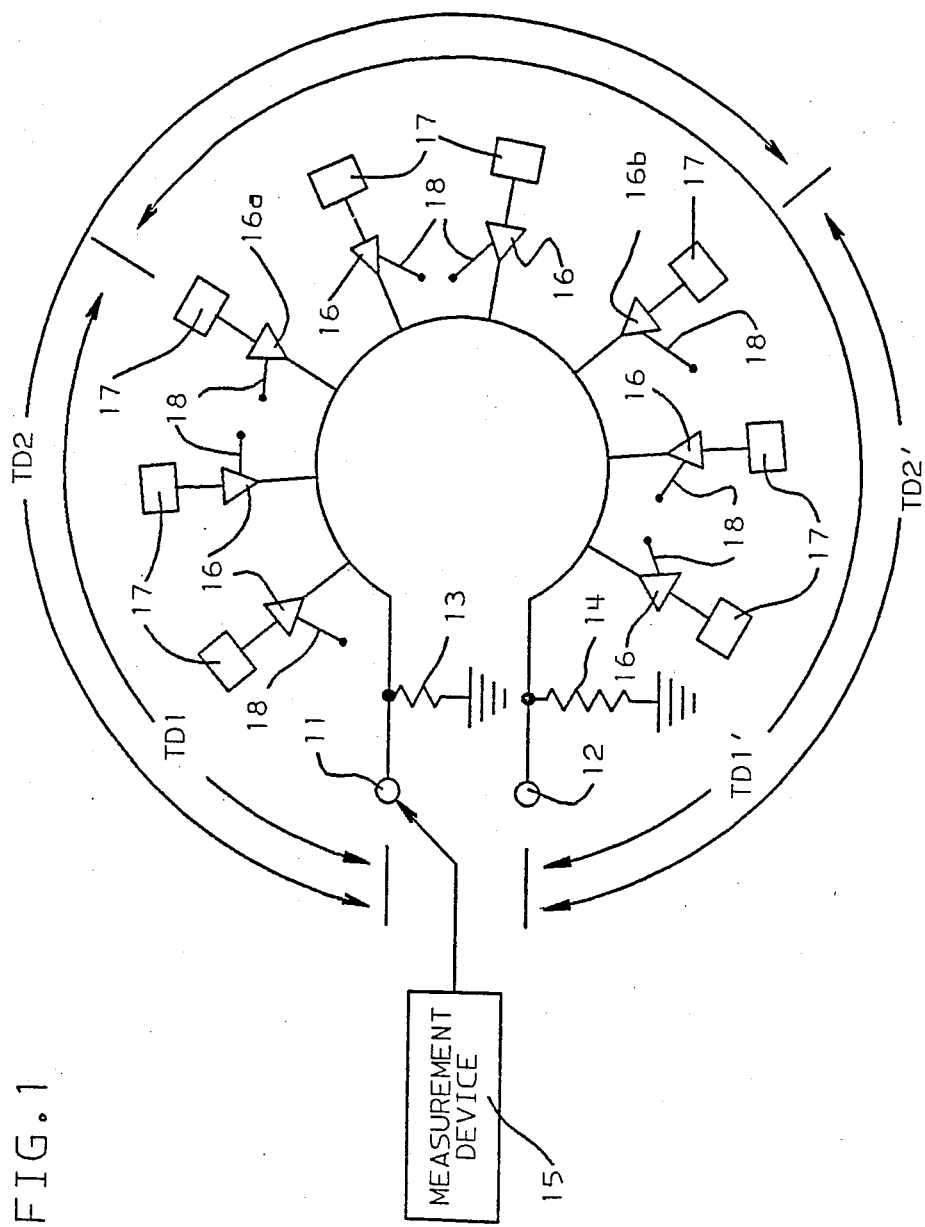
FIG. 1 schematically depicts a transmission line having a plurality of signals applied thereto via a plurality of sensor inputs to the transmission line.

Referring now to FIG. 1 there is showing a high frequency transmission line 10 which is terminated at both end nodes 11 and 12 by impedances 13 and 14. This transmission line is a continuous signal path having a characteristic impedance and capacitance per unit length. An AC signal measuring device 15, such as an oscilloscope, is switchably coupled to each end node 11 and 12. Disposed along and coupled to the line are a plurality of input signal sensors 16 to which are coupled to high frequency signal sources 17. Each sensor is controlled by an external logic signal introduced into the sensor through node 18 from a suitable source, not shown.

If a device such as a sensor 16, which exhibits capacitance inductance, or resistance, is coupled into a transmission line a discontinuity will result. This discontinuity will cause phase and voltage distortions of signals passing thru the line. However, if a plurality of such sensors are placed at equal intervals and at close proximity along the complete length of the transmission line the lumped discontinuities becomes a distributed parameter medium which will pass signals with minimum distortion. If, for example each device exhibits capacitance C, the transmission line would appear to be continuous but have a characteristic impedance of:

$$Z = Z_o \sqrt{\frac{1}{1 + NC/C_o}}$$

where:

$Z_o$ is the unloaded transmission line impedance.
$C_o$ is the total unloaded transmission line capacitance.
N is the number of devices. The propagation delay T of the transmission line is increased by $$T = T_o \sqrt{1 + NC/C_o}$$

where:

$T_o$ = unloaded transmission line propagation delay.

Although the characteristic impedance and propagation delay of the unloaded transmission line have been altered by the addition of these sensors 16, the rise time (frequency and phase components) of the signal will not change because of the additional capacitance. This is identical to the effect observed in transmission lines constructed with different dielectric materials. A transmission line constructed with a teflon or polyethylene dielectric having a dielectric constant of 2.3 will propagate a signal 30% faster than a transmission line constructed with a G-10 dielectric having a dielectric constant of 4.7. However, the rise time of the signals at the end of either transmission line will be identical. Similarly the rise time at the end of 50 ohm transmission line will be identical to the rise time of a 100 ohm transmission line even though the former exhibits more capacitance per unit length. The above conclusions of course assume the effects of skin effect and dielectric absorption are the same in both cases and thus neglects them.

Distortion however can occur because of the physical distance between lumped elements on the delay line. It should be noted that although the signal propagation velocity was reduced because of the additional sensor capacitance the propagation velocity $T_o$ between sensors is still the velocity of the unloaded transmission line, as indicated in the equation below where:

$$T_o = 1.017 \sqrt{Er} \quad \text{(nanoseconds/ft)}$$

where:

ER is the relative dielectric constant of the transmission line dielectric.

Thus phase distortion is minimal.

The sensors 16 can each be any amplification or switching device, such as an active transistor which matches the impedance of the signal sources to the impedance of the transmission line 10. Generally however such sensors must be small enough to permit mounting in close proximity to one another along the line. In one version of the line a dielectric having a relative dielectric constant of 4.7 was used together with transistor sensors, (siliconic U440 dual FETs) spaced at intervals of approximately 0.25 inches along the line.

The measuring device 15 utilized can be any high frequency instrument which is capable of measuring the signals at each end of the transmission line. It must not alter the impedance of the terminations and it must have the capability of measuring the signal at both terminations. For example in the actual embodiment, two relays, an MD5000 dual pnp transistor and a Plessey 9685 comparator provides these requirements.

As noted above sensors 16 are equally spaced in close proximity to one another have their outputs each connected to the same transmission line 10 as shown in FIG. 1. The output of any one sensor may be switched onto or disconnected from the transmission line 10 by a logic signal 18. A measurement device 15, such as an oscilloscope comparator, etc. is used to measure the signal at each end of the transmission line. The time average value of these measurements is then utilized to yield a measurement which is independent of transmission time propagation delay or sensor position on the line.

If the time relationship (delay) TDR between two input signal pulses, T1 and T2 received at signal sources 16a and 16b respectively, are to be compared the measurement, with reference to FIG. 1 is accomplished as follows.

The sensor 16a input signal is connected to the transmission line 10 by logic signal 18a. The time at which the signal T1 reaches node 11 is measured and recorded. This reading is displaced in time by the propagation delay of the line TD1. A similar reading is made at node 12. This reading is displaced in time by the propagation delay of the line TD1. The arithmetic mean of these readings yield:

$$\frac{T1 + TD1 + TD1'}{2}$$

The sensor 16a is disconnected and a different sensor 16b is connected. The measurements at nodes 11 and 12 are repeated, that is, the time the signal T2 takes to travel from sensor 16b to node 11 thru the line propagation delay TD2, and the time it takes the signal T2 to travel thru the line propagation delay TD2'. The arithmetic mean of these readings yield:

$$\frac{T2 + TD2 + TD2'}{2}$$

The difference in the two readings yield the phase or delay between the two signals.

Figure 2:
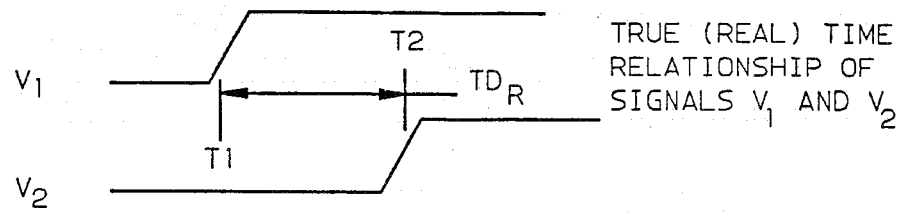
FIG. 2 illustrates the real time relationship of two of the signals applied to the transmission line.
Figure 3:
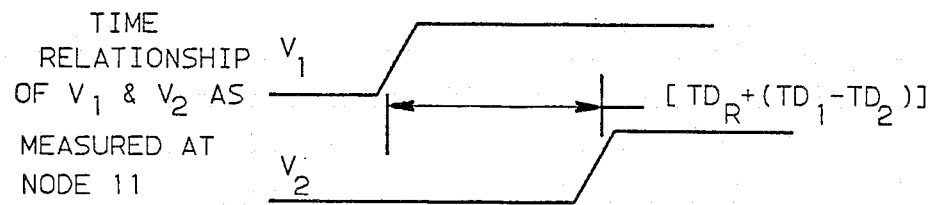
FIG. 3 illustrates the time relationship of the applied signals as observed at the measuring apparatus at one end of the transmission line.
Figure 4:
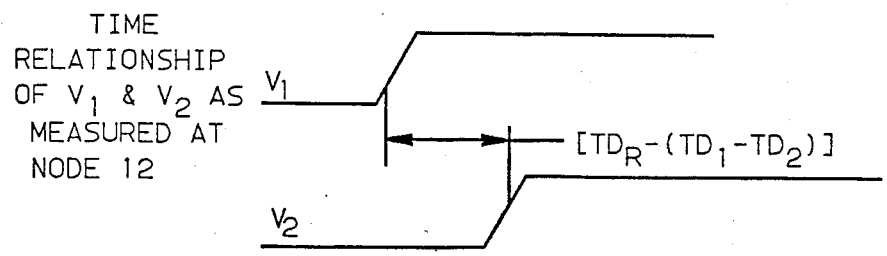
FIG. 4 illustrates the time relationship of the same signals observed at the measurement apparatus at the other end of the transmission line.

FIG. 2 shows, graphically, the true or real time relationship of the two input signals V1 and V2 whose time relationship TDR is to be measured. FIG. 3 shows the time relationship of input signals V1 and V2 as measured at node 11 and FIG. 4 shows the time relationship of V1 and V2 as measured at node 12. It should be noted that these FIGS. 2, 3, and 4 delineate the signals observed at the different nodes 11 and 12 on the circuit of FIG. 1 and that the time average of the propagation delay signals yields the desired result.

As noted above in the present invention because the sensors are close to one another and equally spaced from one another the signal enters the line 10, which appears as a continuous distributed parameter signal path having the impedance of Z, and propagates in both directions at equal speed. Because the line is terminated at both ends by the impedances Z no reflections occur. The signal is observed at both terminations and the arithmetic mean of time phase information is computed. This computation makes the measurements independent of the physical position of the sensor on the line.

FIG. 2 shows, graphically, the true or real time relationship TDR of two input signals V1 and V2 when these signals are inputted to transmission line 10 via sensors 16a and 16b respectively. It is this true time relationship which is to be determined.

When the measurement device 15 is coupled to one end of the transmission line 10, e.g. node 11, the measured time relationship of the signals V1 and V2, at this node 11, is equal to the true time relationship TDR between the signals plus the propagation delay of that portion of the transmission line 10 between the sensors 16a and 16b, i.e. TD2−TD1. This measured relationship is shown in FIG. 3.

From this one bit of measured information alone and without knowing the propagation delay of the line between the sensors 16a and 16b it is impossible to determine the true time relationship TDR between the signals V1 and V2.

Similarly when the measuring device 15 is connected to the other end, node 12, of transmission line 10 the time relationship of the two signals V1 and V2 is again measured. At this end the measured time relationship is equal to the true time relationship TDR minus the propagation delay TD2−TD1 of that portion of the line 10 between the sensor 16a and 16b, i.e. this measured relationship is shown in FIG. 6.

Again from this single piece of information alone and without knowing the propagation delay of the line 10 between the sensors 16a and 16b it is impossible to determine the true time relationship TDR between the signal V1 and V2.

However, the present inventor has found that the sum of both of these measurements is equal to twice that of the true time relationship between the signals V1 and V2. This is more clearly shown by the expression below.

$$(TDR+(TD2-TD1))+(TDR-(TD2-TD1))=2\ TDR$$

Thus, it is unnecessary to know either the physical position of the sensors on the line or to know the propagation delay of the transmission line to which the sensors are coupled.

The invention thus teaches an AC measurement apparatus which permits measurement of multiple unknown signal sources independent of the physical distance between the signal source and the measurement device. This means the measurement transmission line is effectively transparent to the measurement device and the time relationship of the signals can be measured with substantially no loss and no phase change due either to physical position or propagation delay change due to physical position of the signal source on the line.

Having now described the present invention it will become apparent to any one skilled in the art that additional modifications and changes to the invention can be made. Accordingly, the invention is to be delineated only by the following claims.

What is claimed is:

1. An apparatus for measuring the time delay between the introduction of two signals applied to a transmission line comprising;
   a transmission line having a propagation delay and a characteristic impedance,
   means coupled to the transmission line for introducing two signals into the transmission line, and
   means coupled to each end of the transmission line for determining the time between the introduction of said two signals into said transmission line independent of the propagation delay of the transmission line,
   said means for determining the time between the signals independent of the transmission line propagation delay, comprising
   means for measuring the time between the introduction of the two signals at one end of the transmission line, and for measuring the time between the introduction of the two signals at the other end of the transmission line.

2. The apparatus of claim 1 wherein said determining means further comprises means for adding the measured times to each other to obtain a value equal to twice the time delay between the measured signals irrespective of the propagation delay of the transmission line.

3. The apparatus of claim 2 wherein said means for introducing two signals into different points on the transmission line comprises input signal sensors coupled to said different points on the transmission line and to a source of signals.

4. The apparatus of claim 3 wherein said sensors each comprise an active transistor that matches the impedence of the source of signals to the impedence of the line and said means for determining the time between the signals comprises a high frequency measurement device switchable coupled to both ends of the transmission line.

5. The apparatus of claim 3 wherein each of said sensors is controlled by an external logic signal and said means for determining the time between the signals independent of the transmission line propagation delay comprises an oscilloscope coupled to each end of the transmission line through respective switches.

6. A transmission line combining lumped and distributed elements and having minimum phase distortion, a relative dielectric contant and a plurality of signal input devices exhibiting inductance and lumped discontinuities on the line coupled to the line in close proximity to one another, each of the signal input devices being provided with means of selectively coupling a selected signal into the line and a high frequency measurement device coupled to each end of said line for measuring at each end of said line the time of introduction of a selected signal into said line with respect to any other selected signal introduced into said line.

7. A method for measuring the time delay between two signals applied to a transmission line having a propagation delay, having a plurality of signal inputs and having each end terminated by an impedance, and a high frequency measurement device switchably coupled to both ends of the transmission line comprising the steps of;
   introducing first and second signals into different points on a transmission line having first and second ends, and
   determining the time between the introduction of said first and second signals independent of the propagation delay of the transmission line,
   said determining step including
   coupling a high frequency measurement device to the first and second ends of said transmission line,
   measuring the time between the receipt of first and second signals at one end of the transmission line,
   measuring the time between receipt of said first and second signals at the second end of the transmission line, and
   adding said measured times to each other to obtain a value equal to twice the time delay between the introduction of said first and second signals irrespective of the propagation delay of the transmission line.

* * * * *